United States Patent
Cagno et al.

(10) Patent No.: US 8,037,380 B2
(45) Date of Patent: Oct. 11, 2011

(54) VERIFYING DATA INTEGRITY OF A NON-VOLATILE MEMORY SYSTEM DURING DATA CACHING PROCESS

(75) Inventors: Brian J. Cagno, Tucson, AZ (US); John C. Elliott, Tucson, AZ (US); Robert A. Kubo, Tucson, AZ (US); Gregg S. Lucas, Tucson, AZ (US)

(73) Assignee: International Business Machines Corporation, Armonk, NY (US)

( * ) Notice: Subject to any disclaimer, the term of this patent is extended or adjusted under 35 U.S.C. 154(b) by 567 days.

(21) Appl. No.: 12/169,273

(22) Filed: Jul. 8, 2008

(65) Prior Publication Data

US 2010/0011261 A1    Jan. 14, 2010

(51) Int. Cl.
  *G11C 29/00*   (2006.01)
  *G06F 13/00*   (2006.01)
(52) U.S. Cl. ...................................... 714/718; 711/118
(58) Field of Classification Search ............... 714/24, 714/25, 718, 723; 711/118; 365/201, 228
  See application file for complete search history.

(56) References Cited

U.S. PATENT DOCUMENTS

| | | |
|---|---|---|
| 4,974,118 A | 11/1990 | Rounds |
| 5,262,999 A | 11/1993 | Etoh et al. |
| 5,430,674 A | 7/1995 | Javanifard |
| 5,438,549 A | 8/1995 | Levy |
| 5,496,939 A | 3/1996 | Maruyama |
| 5,555,371 A | 9/1996 | Duyanovich et al. |
| 5,644,531 A | 7/1997 | Kuo et al. |
| 5,661,349 A | 8/1997 | Luck |
| 5,732,238 A | 3/1998 | Sarkozy |
| 5,793,776 A | 8/1998 | Qureshi et al. |
| 5,944,837 A | 8/1999 | Talreja et al. |
| 6,016,472 A | 1/2000 | Ali |

(Continued)

FOREIGN PATENT DOCUMENTS

JP    2000-194607    7/2000

(Continued)

OTHER PUBLICATIONS

Varma, A.; Jacobson, Q.; , "Destage algorithms for disk arrays with nonvolatile caches," Computers, IEEE Transactions on , vol. 47, No. 2, pp. 228-235, Feb. 1998 doi: 10.1109/12.663770 URL:http://ieeexplore.ieee.org/stamp/stamp.jsp?tp=&arnumber=663770&isnumber=14539.*

(Continued)

*Primary Examiner* — Cynthia Britt
(74) *Attorney, Agent, or Firm* — Stephen R. Tkacs; Stephen J. Walder, Jr.; Randall J. Bluestone

(57) ABSTRACT

To ensure integrity of non-volatile flash, the controller programs the non-volatile memories with background test patterns and verifies the non-volatile memories during power on self test (POST) operation. In conjunction with verifying the non-volatile memories, the controller may routinely run diagnostics and report status to the storage controller. As part of the storage controller power up routines, the storage controller issues a POST command to the controller via an I²C register that is monitored by the storage controller. The storage controller may determine that the non-volatile flash is functional without any defects, and the controller may remove power from the non-volatile flash to extend its reliability. Periodically, in the background, the controller may run diagnostic routines to detect any failures associated with the volatile memory and the controller itself.

20 Claims, 5 Drawing Sheets

U.S. PATENT DOCUMENTS

| | | | |
|---|---|---|---|
| 6,236,593 B1 | 5/2001 | Hong et al. | |
| 6,282,670 B1 | 8/2001 | Islam et al. | |
| 6,378,033 B1 | 4/2002 | Nishikawa | |
| 6,496,939 B2 | 12/2002 | Portman et al. | |
| 6,658,435 B1 | 12/2003 | McCall | |
| 6,680,548 B2 | 1/2004 | Shiue et al. | |
| 6,785,786 B1 | 8/2004 | Gold et al. | |
| 7,143,298 B2 | 11/2006 | Wells et al. | |
| 7,315,951 B2 | 1/2008 | Hanrieder et al. | |
| 7,451,348 B2 * | 11/2008 | Pecone et al. | 714/14 |
| 2002/0029354 A1 * | 3/2002 | Forehand et al. | 713/340 |
| 2002/0049917 A1 | 4/2002 | Portman et al. | |
| 2004/0052502 A1 | 3/2004 | Komatsu et al. | |
| 2004/0218434 A1 | 11/2004 | Hwang et al. | |
| 2004/0224192 A1 | 11/2004 | Pearson | |
| 2005/0010838 A1 * | 1/2005 | Davies et al. | 714/100 |
| 2005/0063217 A1 | 3/2005 | Shiraishi et al. | |
| 2005/0283648 A1 | 12/2005 | Ashmore | |
| 2006/0047985 A1 | 3/2006 | Otani | |
| 2006/0108875 A1 | 5/2006 | Grundmann et al. | |
| 2006/0212644 A1 | 9/2006 | Acton et al. | |
| 2006/0248269 A1 | 11/2006 | Shona | |
| 2006/0255746 A1 | 11/2006 | Kumar et al. | |
| 2006/0259756 A1 | 11/2006 | Thompson et al. | |
| 2006/0264188 A1 | 11/2006 | Mars et al. | |
| 2007/0002675 A1 | 1/2007 | Koo | |
| 2007/0033433 A1 | 2/2007 | Pecone et al. | |
| 2007/0133277 A1 | 6/2007 | Kawai et al. | |
| 2007/0180184 A1 | 8/2007 | Sakashita et al. | |
| 2008/0016385 A1 * | 1/2008 | Hollingsworth et al. | 714/3 |
| 2008/0086615 A1 | 4/2008 | Elliott et al. | |
| 2008/0201622 A1 * | 8/2008 | Hiew et al. | 714/718 |
| 2009/0254772 A1 | 10/2009 | Cagno et al. | |
| 2009/0323452 A1 | 12/2009 | Cagno et al. | |
| 2009/0327578 A1 | 12/2009 | Cagno et al. | |
| 2010/0052625 A1 | 3/2010 | Cagno et al. | |

FOREIGN PATENT DOCUMENTS

JP            2002-312250            10/2002

OTHER PUBLICATIONS

Thomasian, A.; , "Priority queueing in RAID disk arrays with an NVS cache," Modeling, Analysis, and Simulation of Computer and Telecommunication Systems, 1995. MASCOTS '95., Proceedings of the Third International Workshop on , vol., No., pp. 168-172, Jan. 18-20, 1995 doi: 10.1109/MASCOT.1995.378692.*

USPTO U.S. Appl. No. 12/099,373; Image File Wrapper printed Jan. 3, 2011, 2 pages.

USPTO U.S. Appl. No. 12/145,969; Image File Wrapper printed Jan. 3, 2011, 2 pages.

USPTO U.S. Appl. No. 12/146,098; Image File Wrapper printed Jan. 3, 2011, 1 page.

USPTO U.S. Appl. No. 12/204,456; Image File Wrapper printed Jan. 3, 2011, 1 page.

"Patented Wear Leveling", BitMicro Networks, http://www.bitmicro.com/products_edisk_features_wearlevel.php, Printed Jul. 8, 2008, 2 pages. 2008 , 2 pages.

U.S. Appl. No. 12/145,969, filed Jun. 25, 2008, Cagno et al.

U.S. Appl. No. 12/099,373, filed Apr. 8, 2008, Cagno et al.

U.S. Appl. No. 12/146,098, filed Jun. 25, 2008, Cagno et al.

U.S. Appl. No. 12/204,456, filed Sep. 4, 2008, Cagno et al.

"Method and Procedure to Minimize Peak Power Load During Backup of Volatile Memory with Flash Memory Devices", IBM Technical Bulletin, http://www.ip.com/pubview/IPCOM000167428D, Feb. 13, 2008, 6 pages.

"Patented Wear Leveling", BitMicro Networks, http://www.bitmicro.com/products_edisk_features_wearlevel.php, Printed Jul. 8, 2008, 2 pages.

Office Action mailed Feb. 28, 2011 for U.S. Appl. No. 12/146,098; 18 pages.

Response to Office Action filed with the USPTO on Mar. 7, 2011 for U.S. Appl. No. 12/099,373; 14 pages.

Response to Office Action filed with the USPTO on Mar. 24, 2011 for U.S. Appl. No. 12/145,969; 19 pages.

Kim, Jesung "A Space-Efficient Flash Translation Layer for CompactFlash Systems", IEEE Transactions on Consumer Electronics, May 2002, vol. 48, No. 2, pp. 366-375.

Response to Office Action filed with the USPTO on May 24, 2011 for U.S. Appl. No. 12/146,098, 15 pages.

"Using Compression to Expedite Hardening Process of a Non-Volatile Memory DIMM System", IBM Technical Disclosure, http://www.ip.com/pubview/IPCOM000167472D, Feb. 15, 2008, 4 pages.

Final Office Action mailed Jul. 28, 2011 for U.S. Appl. No. 12/146,098, 19 pages.

Notice of Allowance mailed Jun. 9, 2011 for U.S. Appl. No. 12/145,969, 18 pages.

Office Action mailed Jun. 22, 2011 for U.S. Appl. No. 12/099,373, 12 pages.

Supplemental Notice of Allowability mailed Jul. 29, 2011 for U.S. Appl. No. 12/145,969, 11 pages.

* cited by examiner

US 8,037,380 B2

VERIFYING DATA INTEGRITY OF A NON-VOLATILE MEMORY SYSTEM DURING DATA CACHING PROCESS

BACKGROUND OF THE INVENTION

1. Field of the Invention

The present application relates generally to a dual mode memory system for verifying data integrity of a non-volatile memory system during data caching process.

2. Background of the Invention

A storage area network (SAN) is a network of storage disks. In large enterprises, a SAN connects multiple servers, or hosts, to a centralized pool of disk storage. Compared to managing hundreds of servers, each with its own disks, a SAN improves system administration. By treating all the company's storage as a single resource, disk maintenance and routine backups are easier to schedule and control. In some SANs, the disks themselves can copy data to other disks for backup without any processing overhead at the host computers.

A storage system typically comprises a plurality of storage devices and a storage controller in an enclosure. The storage controller may be a redundant array of independent disks (RAID) controller, for example. The storage controller receives host input/output (I/O) traffic to read and write data to the disk drives. The storage controller then reads data from or persists data to the disk drives via device I/O traffic. In storage systems, data is temporarily stored in volatile memory, such as Double Data Rate (DDR) Random Access Memory (RAM), due to the extremely fast access speeds that are required to meet maximum throughput to the disk drives.

BRIEF SUMMARY OF THE INVENTION

In one illustrative embodiment, a computer program product comprises a computer recordable medium having a computer readable program recorded thereon. The computer readable program, when executed on a computing device, causes the computing device to program a non-volatile memory with a set of test patterns. The non-volatile memory is used to harden cache data from a volatile memory for a storage controller responsive to a power event. The computer readable program further causes the computing device to read the set of test patterns from the non-volatile memory, verify whether the non-volatile memory stored the set of test patterns correctly, and post a failure status to the storage controller responsive to the non-volatile memory storing the set of test patterns incorrectly.

In another illustrative embodiment, a method, in a data processing system, for verifying data integrity of a non-volatile memory system during data caching process, the method comprises programming a non-volatile memory with a set of test patterns. The non-volatile memory is used to harden cache data from a volatile memory for a storage controller responsive to a power event. The method further comprises reading the set of test patterns from the non-volatile memory, verifying whether the non-volatile memory stored the set of test patterns correctly, and posting a failure status to the storage controller responsive to the non-volatile memory storing the set of test patterns incorrectly.

In another illustrative embodiment, a memory system comprises a controller, a volatile memory, and a non-volatile memory. The controller is configured to detect a power event from a power supply that provides power to a storage controller and the memory system. The non-volatile memory is used to harden cache data from the volatile memory for a storage controller responsive to the power event. The controller is configured to program the non-volatile memory with a set of test patterns. The non-volatile memory is used to harden cache data from a volatile memory for a storage controller. The controller is configured to read the set of test patterns from the non-volatile memory, verify whether the non-volatile memory stored the set of test patterns correctly, and post a failure status to the storage controller responsive to the non-volatile memory storing the set of test patterns incorrectly.

These and other features and advantages of the present invention will be described in, or will become apparent to those of ordinary skill in the art in view of, the following detailed description of the exemplary embodiments of the present invention.

BRIEF DESCRIPTION OF THE SEVERAL VIEWS OF THE DRAWINGS

The invention, as well as a preferred mode of use and further objectives and advantages thereof, will best be understood by reference to the following detailed description of illustrative embodiments when read in conjunction with the accompanying drawings, wherein.

DETAILED DESCRIPTION OF THE INVENTION

Figure 1:
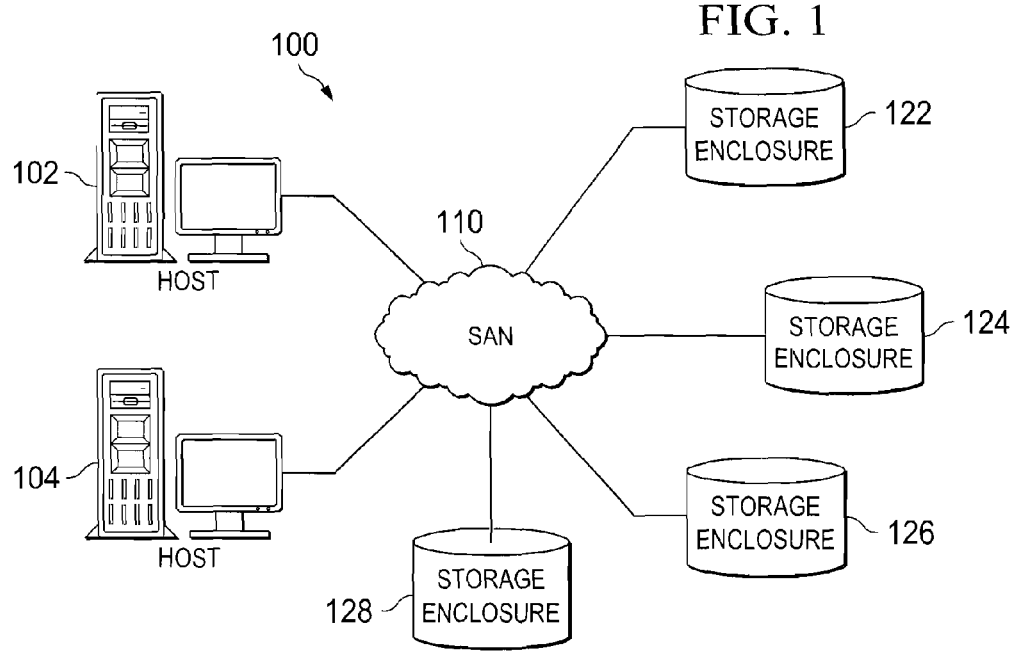
FIG. 1 depicts a pictorial representation of an exemplary distributed data processing system in which aspects of the illustrative embodiments may be implemented.
Figure 2:
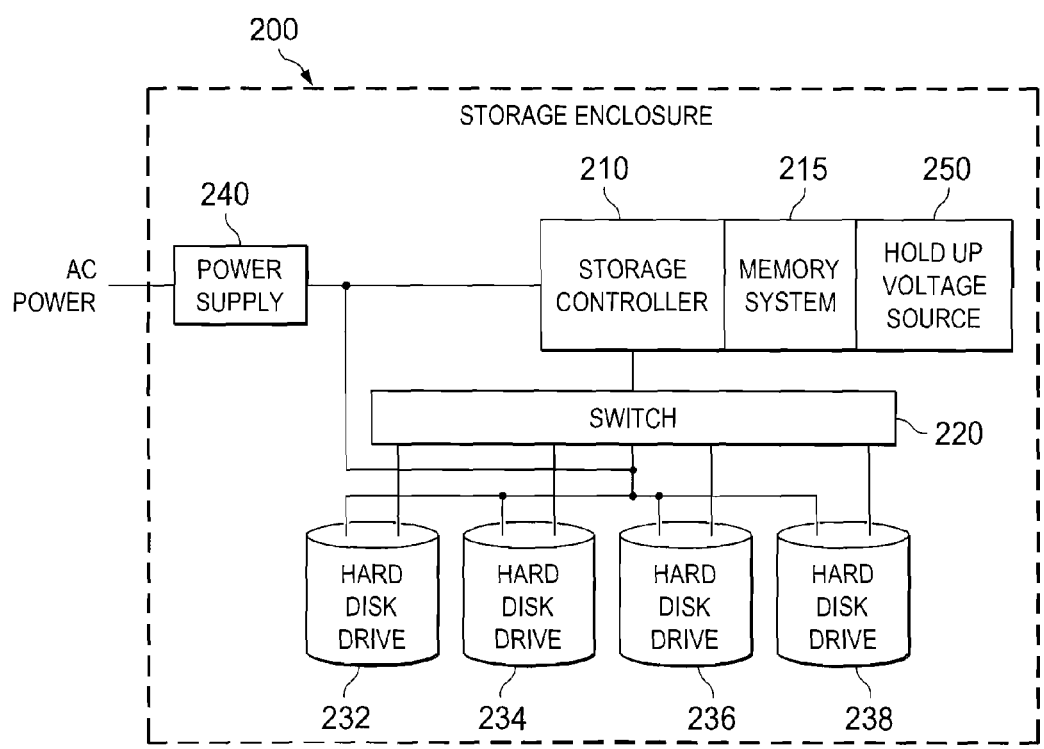
FIG. 2 is a block diagram depicting an exemplary storage enclosure in accordance with an illustrative embodiment.

The illustrative embodiments provide a mechanism to verify data integrity of a non-volatile memory system during data caching process. To ensure integrity of non-volatile flash, the controller programs the non-volatile memories with background test patterns and verifies the non-volatile memories during power on self test (POST) operation. In conjunction with verifying the non-volatile memories, the controller may routinely run diagnostics and report status to the storage controller. As part of the storage controller power up routines, the storage controller issues a POST command to the controller via an $I^2C$ register that is monitored by the storage controller. The storage controller may determine that the non-volatile flash is functional without any defects, and the controller may remove power from the non-volatile flash to extend its reliability. Periodically, in the background, the controller may run diagnostic routines to detect any failures associated with the volatile memory and the controller itself The illustrative embodiments may be utilized in many different types of data processing environments including a distributed data processing environment, a single data processing device, or the like. In order to provide a context for the description of the specific elements and functionality of the illustrative embodiments, FIGS. 1 and 2 are provided hereafter as exemplary environments in which exemplary aspects of the illustrative embodiments may be implemented. While the description following FIGS. 1 and 2 will focus primarily on a storage enclosure implementation, this is only exemplary and is not intended to state or imply any limitation with regard to the features of the present invention. To the contrary, the illustrative embodiments are intended to include any embodiments in which a super-capacitor is used to temporarily hold up voltage for components.

With reference now to the figures and in particular with reference to FIGS. 1 and 2, exemplary diagrams of data processing environments are provided in which illustrative embodiments of the present invention may be implemented. It should be appreciated that FIGS. 1 and 2 are only exemplary and are not intended to assert or imply any limitation with regard to the environments in which aspects or embodiments of the present invention may be implemented. Many modifications to the depicted environments may be made without departing from the spirit and scope of the present invention.

FIG. 1 depicts a pictorial representation of an exemplary distributed data processing system in which aspects of the illustrative embodiments may be implemented. Distributed data processing system 100 may include a network of computers in which aspects of the illustrative embodiments may be implemented. The distributed data processing system 100 contains at least one storage area network 110, which is the medium used to provide communication links between various devices and computers, such as host computers and storage enclosures, connected together within distributed data processing system 100. Storage area network 110 may include connections, such as wire, wireless communication links, serial attached small computer systems interface (serial attached SCSI or SAS) switches, or fiber optic cables.

In the depicted example, host computer 102 and host computer 104 are connected to storage area network (SAN) 110 along with storage enclosures 122, 124, 126, and 128. A storage enclosure includes a storage controller and connection to one or more hard disk drives. The storage controller may be a simple controller for storing data to the hard disk drives, or alternatively may include a redundant array of independent disks (RAID) controller. Distributed data processing system 100 may include additional hosts, storage enclosures, clients, and other devices not shown.

In the depicted example, SAN 110 may use the Transmission Control Protocol/Internet Protocol (TCP/IP) suite of protocols to communicate with one another; however, more likely, SAN 110 may use a protocol associated with Fibre Channel (FC) or Serial attached SCSI (SAS). As stated above, FIG. 1 is intended as an example, not as an architectural limitation for different embodiments of the present invention, and therefore, the particular elements shown in FIG. 1 should not be considered limiting with regard to the environments in which the illustrative embodiments of the present invention may be implemented.

FIG. 2 is a block diagram depicting an exemplary storage enclosure in accordance with an illustrative embodiment. Storage enclosure 200 comprises storage controller 210, which may be a redundant array of independent disks (RAID) controller or a non-RAID controller. Storage controller 210 communicates with hard disk drives (HDDs) 232, 234, 236, and 238 through switch 220. Switch 220 may be, for example, a serial attached SCSI (SAS) switch. Other devices in a storage area network (SAN) may write data to or read data from storage enclosure 200 by connection to switch 220.

Storage controller 210 may store data temporarily in memory system 215 before persisting the data to HDDs 232-238. Memory system 215 may comprise a Double Data Rate (DDR) memory system that provides fast access speeds to meet required maximum throughput to HDDs 232-238. DDR memory is a volatile memory.

Power supply 240 receives alternating current (AC) power and provides direct current (DC) power to the components within storage enclosure 200. More particularly, power supply 240 provides DC power to storage controller 210, memory system 215, switch 220, and HDDs 232-238. If AC power to storage enclosure 200 is lost or interrupted, then there is a data integrity exposure within memory system 215.

One approach to solving data integrity exposure due to power failure is to hold up power to the entire enclosure using battery power while the data is written to disk. This approach requires very large and expensive uninterruptible power supply (UPS) units. Another approach involves using a small battery and placing the memory into self refresh mode. Typically, a battery may allow the volatile memory to hold data for 72 hours. Even this battery can become large and expensive. Both solutions require chemical batteries to be used, which can also create safety hazards if not used or disposed of properly.

In accordance with an illustrative embodiment, memory system 215 includes a non-volatile storage element that is used to save data from the volatile memory when power is lost and a hold up voltage source 250 that is used to hold up the voltage while the data is saved to non-volatile storage.

Figure 3:
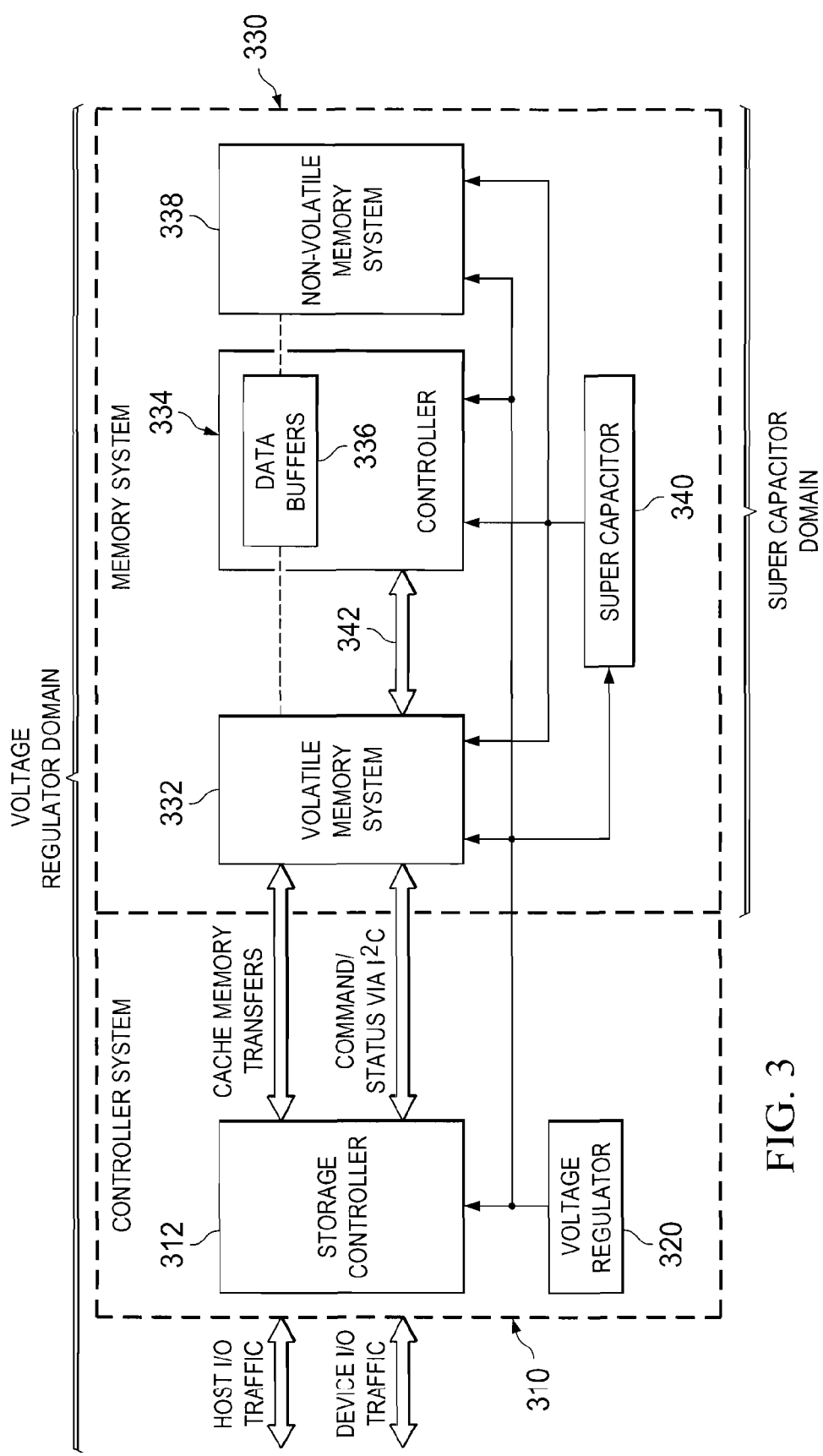
FIG. 3 is a block diagram illustrating a controller system and memory system in accordance with an illustrative embodiment.

FIG. 3 is a block diagram illustrating a controller system and memory system in accordance with an illustrative embodiment. Controller system 310 comprises storage controller 312 and voltage regulator 320. Controller system 310 receives host input/output (I/O) traffic to load data to or store data from the host. Controller system 310 also receives device I/O traffic to store data to or load data from storage devices. Storage controller 312 temporarily stores data in volatile memory system 332 within memory system 330 via cache memory transfers.

Storage controller 312 also performs commands and updates status information using an inter-integrated circuit (I²C) bus. Normally, the I²C bus is only used to read configuration information. However, in accordance with the illustrative embodiment, storage controller 312 may not only read configuration information via the I²C bus, but also send commands to memory system 330 using the I²C bus.

Memory system 330 comprises volatile memory system 332, non-volatile memory system 338, controller 334, and super capacitor 340. Volatile memory system 332 may be a Double Data Rate (DDR) memory, for example. Non-volatile memory system 338 may be a flash memory, for example. Controller 334 stores data from volatile memory system 332 to non-volatile memory system 338. Controller 334 may store data temporarily in data buffers 336 as data is transferred to non-volatile memory system 338.

Voltage regulator 320 provides direct current (DC) power to storage controller 312, volatile memory system 332, controller 334, and non-volatile memory system 338. Voltage regulator 320 may provide a voltage in the range of 3.0V to 3.5V, such as 3.3V, for example. However, the voltage may be higher or lower depending on the implementation. Voltage regulator 320 also provides DC power to charge super capacitor 340 to a predetermined voltage limit. Responsive to normal power being lost from voltage regulator 320, super capacitor 340 becomes the source of power for volatile memory system 332, controller 334, and non-volatile memory system 338.

As memory system 330 hardens the data (transfers the data from volatile memory system 332 to non-volatile memory system 338), super capacitor 340 begins to discharge. At some point, the voltage provided by super capacitor 340 begins to decay as a function of the load. When the voltage of super capacitor 340 falls below the minimum voltage requirement of memory system 330, operation may become nondeterministic and failures may occur.

From the above, it is paramount that the cache data hardening time should be minimized to reduce the super capacitor's size and cost, while still maintaining adequate charge in the super capacitor supply system during the hardening process. That is, a longer hardening time requires a larger, more costly super capacitor implementation. In high density storage systems, it is extremely important to minimize the overall footprint and cost in accomplishing a customer's storage solution, and, thus, it is critical to minimize the bulk volume associated with battery or super capacitor backup solutions.

In one exemplary embodiment, the volatile memory system 332 may be implemented as a Double Data Rate (DDR) memory, for example, such as in the form of a dual inline memory module (DIMM). Also, during normal operation, when AC power is lost and the cache data must be transferred to non-volatile memory system 338, it is very important that the process is as reliable and fast as possible. To ensure reliability, controller 334 may read back the contents of the target memory, non-volatile memory system 338, immediately after it is written, to verify whether the data is written correctly. This approach presents two problems: it takes extra time, especially with slow non-volatile memories, to perform a read-after-write operation, and, more importantly, verifying the memory during the hardening process leaves no recourse for reacting to memory failures. Power is lost at this point and whatever data was written to non-volatile memory system 338 will be defective.

Figure 4:
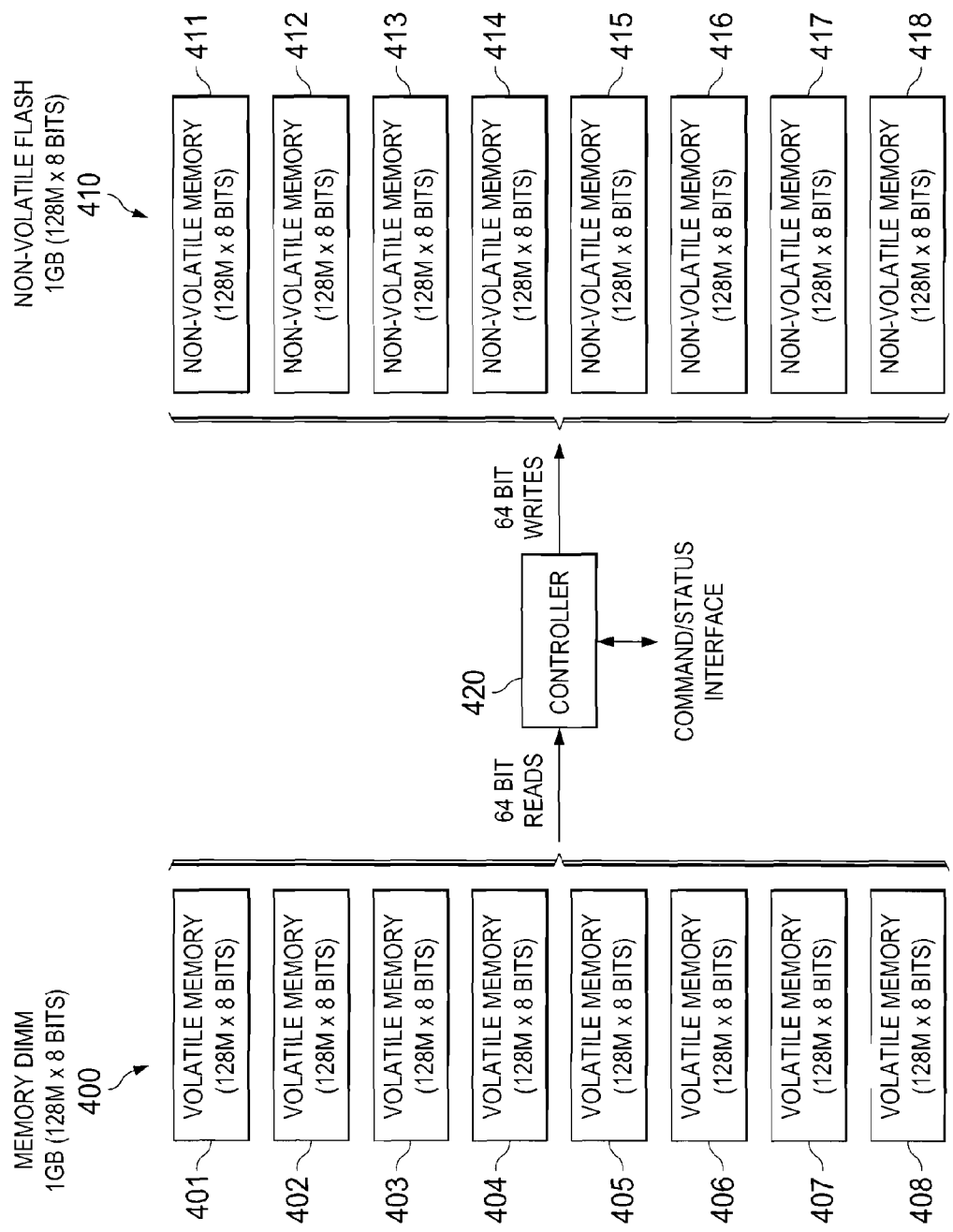
FIG. 4 illustrates a data hardening process in accordance with an illustrative embodiment.

FIG. 4 illustrates a data hardening process in accordance with an illustrative embodiment. Volatile memory dual inline memory module (DIMM) 400 comprises eight volatile memories 401-408. In the illustrative embodiment, volatile memories 401-408 may be 128M by 8 bits, with eight memories comprising 1 GB of memory. Non-volatile memory flash 410 comprises eight non-volatile memories 411-418. In the illustrative embodiment, non-volatile memories 411-418 may be 128M by 8 bits, with eight memories comprising 1 GB of memory to match that of volatile memory DIMM 400.

In response to a power event, such as an early power off warning (EPOW), controller 420 hardens the data in volatile memory DIMM 400 to non-volatile flash 410 by making 64 bit reads from volatile memories 401-408 and making 64 bit writes to non-volatile memories 411-418. Controller 420 may send and receive commands and status information in communication with volatile memory DIMM 400, non-volatile flash 410, and the storage controller (not shown).

In accordance with an illustrative embodiment, to ensure integrity of non-volatile flash 410, controller 420 programs non-volatile memories 411-418 with background test patterns and verifies non-volatile memories 411-418 during power on self test (POST) operation. Once the memory system is verified, it may be powered down to increase reliability. In conjunction with verifying non-volatile memories 411-418, controller 420 may routinely run diagnostics and report status to the storage controller.

As part of the storage controller power up (boot/POST) routines, the storage controller issues a POST command to controller 420 via an I²C interface, such as bus 342 in FIG. 3, for example. Controller 420 acknowledges the command and initiates its own internal POST routines. It also powers up non-volatile flash 410. Controller 420 may then execute a self test of the application specific integrated circuit (ASIC) and field programmable gate array (FPGA) systems (not shown) and, if operational, verify non-volatile flash 410.

To verify non-volatile flash 410, controller 420 may program a unique set of patterns into non-volatile memories 411-418 and then perform a read back process. Once controller 420 verifies non-volatile flash 410, controller 420 posts a status code in an I²C register (not shown) that is monitored by the storage controller. After this initial power up process, controller 420 performs a bulk erase command to non-volatile memories 411-418, which initializes them to a pre-programmed state (and verifies this state) so they will be readily programmable when an EPOW event occurs.

Controller 420 may then send a subsequent command to the storage controller to confirm that non-volatile memories 411-418 are pre-programmed. At this point, the storage controller may determine that non-volatile flash 410 is functional without any defects, and controller 420 may remove power from non-volatile flash 410 to extend its reliability.

Periodically, in the background, controller 420 may run diagnostic routines to detect any failures associated with volatile memory DIMM 400 and controller 420, itself. As part of this background diagnostic process, controller 420 may concurrently read data from volatile memory DIMM 400, when the storage controller is accessing volatile memory DIMM 400, and determine if memory faults exist.

Furthermore, when controller 420 reads from the memory system in its normal course of accessing the cache data in volatile memory DIMM 400, the volatile memory output read data may be simultaneously read by controller 420. If at any time, a failure is detected, controller 420 may post a failure status for the storage controller to read via the command/status interface. As a result, further overall system integrity may be enhanced by implementing a heartbeat mechanism between the storage controller and controller 420.

As will be appreciated by one skilled in the art, the present invention may be embodied as a system, method or computer program product. Accordingly, the present invention may take the form of an entirely hardware embodiment, an entirely software embodiment (including firmware, resident software, micro-code, etc.), or an embodiment combining software and hardware aspects that may all generally be referred to herein as a "circuit," "module" or "system." Furthermore, the present invention may take the form of a computer program product embodied in any tangible medium of expression having computer usable program code embodied in the medium.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, radio frequency (RF), etc.

Computer program code for carrying out operations of the present invention may be written in any combination of one or more programming languages, including an object oriented programming language such as Java™, Smalltalk™, C++, or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The illustrative embodiments are described below with reference to flowchart illustrations and/or block diagrams of methods, apparatus (systems) and computer program products according to the illustrative embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Figure 5:
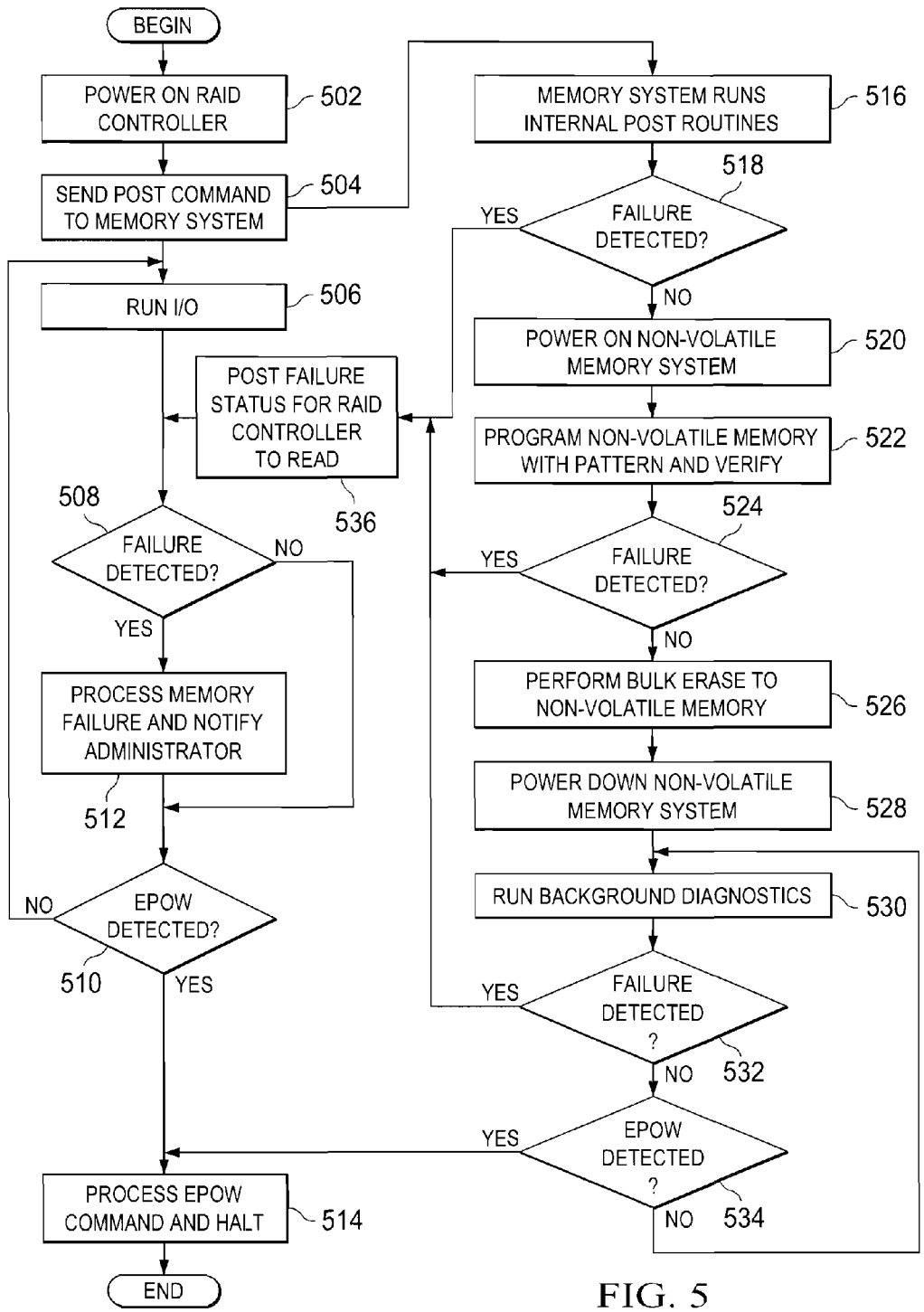
FIG. 5 is a flowchart illustrating operation of a memory system to verify data integrity of non-volatile memory during data caching process in accordance with an illustrative embodiment.

FIG. 5 is a flowchart illustrating operation of a memory system to verify data integrity of non-volatile memory during data caching process in accordance with an illustrative embodiment. Operation begins, and the storage system powers on the redundant array of independent disks (RAID) controller (block 502). The storage controller then sends a power on self test (POST) command to the memory system (block 504). Then, the storage controller runs input/output (block 506). The storage controller determines whether a failure is detected (block 508). The storage controller may determine whether a failure is detected, for example, by reading a register via an $I^2C$ interface, which is written (posted) by the memory system controller.

If the storage controller does not detect a failure in block 508, the storage controller determines whether an early power off warning (EPOW) is detected (block 510). If the storage controller does not detect an EPOW, operation returns to block 506 to run input/output.

If the storage controller detects a failure in block 508, the storage controller processes the memory failure and notifies an administrator (block 512). Thereafter, operation proceeds to block 510 to determine whether an EPOW is detected. If the storage controller detects an EPOW in block 510, the storage controller processes the EPOW command and halts operation (block 514). Thereafter, operation ends.

Concurrently, after the storage controller sends a POST command to the memory system, the memory system runs internal POST routines (block 516). The memory system controller then determines whether a failure is detected during the POST routines (block 518). If the memory system controller does not detect a failure in block 518, then the memory system controller powers on the non-volatile memory system (block 520). The memory system controller programs the non-volatile memory with patterns and verifies the non-volatile memory (block 522). Then, the memory system controller determines whether a failure is detected (block 524). If the memory system controller does not detect a failure in block 524, the memory system controller performs a bulk erase to the non-volatile memory (block 526) and powers down the non-volatile memory system (block 528).

Thereafter, the memory system controller performs background diagnostics (block 530). The memory system controller then determines whether a failure is detected (block 532). If the memory system controller does not detect a failure in block 532, the memory system controller determines whether an EPOW is detected (block 534). If the memory system controller does not detect an EPOW, then operation returns to block 530 to run background diagnostics.

If the memory system controller detects a failure in block 518, block 524, or block 532, the memory system controller posts failure status for the RAID controller to read (block 536). The RAID controller may then detect the failure in block 508. If the memory system controller detects an EPOW in block 534, the memory system controller processes the EPOW command the storage controller halts (block 514). Thereafter, operation ends, and the memory system controller performs data hardening.

Figure 6:
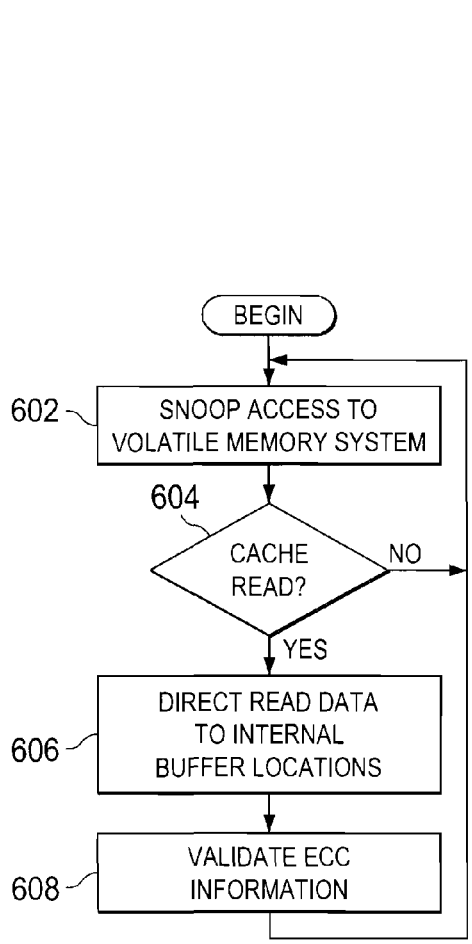
FIG. 6 is a flowchart illustrating background verification of the volatile memory system and controller data pathways in accordance with an illustrative embodiment.

FIG. 6 is a flowchart illustrating background verification of the volatile memory system and controller data pathways in accordance with an illustrative embodiment. In order to perform background verification of the key read data process, a method is employed that runs concurrently with the normal cache data access by the storage controller. Because the memory system controller has no knowledge of how or when the storage controller is accessing the cache data, this concurrent method is implemented that avoids any conflicts. Operation begins and the memory system controller snoops accesses to the volatile memory system (block 602). The memory system controller then determines whether the storage controller performs a cache read (block 604). If the storage controller does not perform a cache read, operation returns to block 602 to snoop accesses to the volatile memory system.

When the storage controller reads a cache data location, the memory system controller directs the same read data to internal buffer locations (block 606) and validates the error correction code (ECC) information (block 608) to verify correct operation of data paths and buffer locations within the memory system controller. Thereafter, operation returns to block 602 to snoop accesses to the volatile memory system. The memory system controller handles all subsequent cache reads similarly and rotates through all the internal data buffers within the memory system controller to further validate the internal data pathing.

Figure 7:
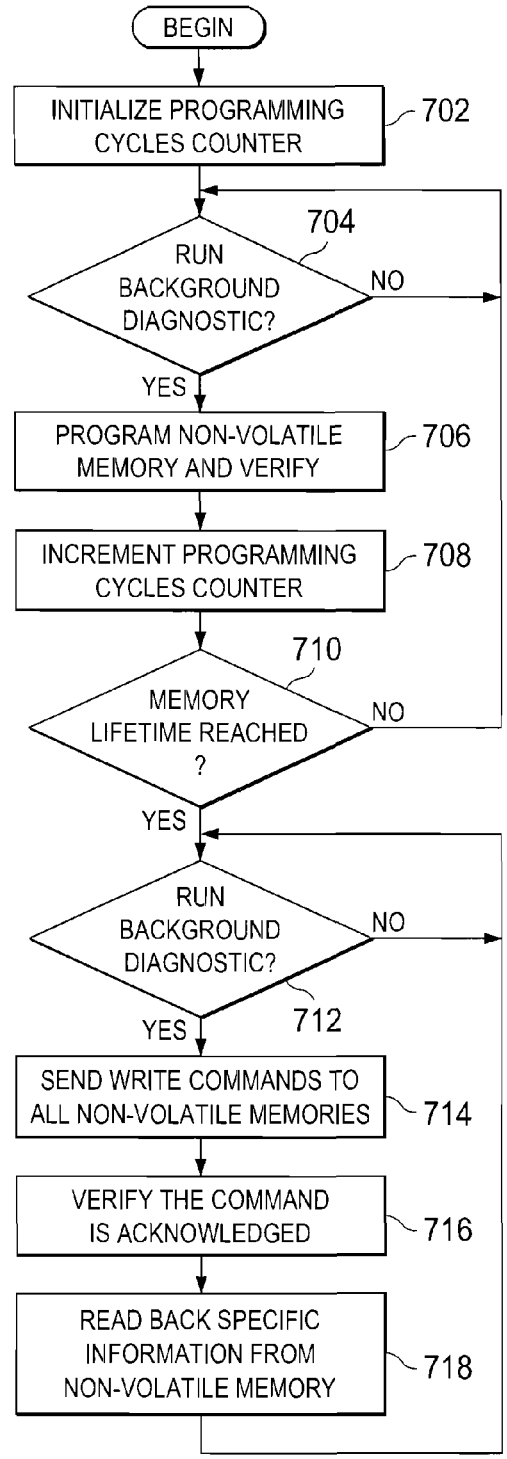
FIG. 7 is a flowchart illustrating background verification of the non-volatile memory system in accordance with an illustrative embodiment.

FIG. 7 is a flowchart illustrating background verification of the non-volatile memory system in accordance with an illustrative embodiment. Concurrent with the read data "snooping" process described above, the memory system controller may perform background verification of the non-volatile memory system. Due to limited flash programming cycle constraints, the memory system controller verifies the flash programming functionality in conjunction with flash read and write access verification. This process multiplexes two background sub-processes.

Operation begins, and the memory system controller initializes a programming cycles counter (block 702). The memory system controller determines whether to run background diagnostics (block 704). If the memory system does not run background diagnostics, operation returns to block 704 until the memory system determines that it is time to run background diagnostics. If the memory system determines to run background diagnostics in block 704, the memory system controller programs the non-volatile memory and verifies the non-volatile memory (block 706). Then, the memory system controller increments the programming cycles counter (block 708). The memory system controller determines whether the non-volatile memory system is close to reaching its lifetime (block 710). Flash memory lifetimes are on the order of 100 k program/erase cycles. This process tests to determine whether the non-volatile memories are close to exceeding their expected lifetimes, perhaps 99 k program/erase cycles, for instance. If the memory system has not reached its lifetime in block 710, then operation returns to block 704 to determine whether to run background diagnostics.

If the memory system has reached its lifetime in block 710, based on the programming cycles counter, the memory system controller determines whether to run background diagnostics (block 712). If the memory system does not run background diagnostics, operation returns to block 712 until the memory system determines that it is time to run background diagnostics. If the memory system determines to run background diagnostics in block 712, the memory system controller sends write commands to all non-volatile memories (block 714). Then, the memory system controller verifies the command is acknowledged (block 716) and reads back specific information from the non-volatile memory, such as the vendor ID (block 718). Thereafter, operation returns to block 712 to determine whether to run background diagnostics.

Thus, the illustrative embodiments provide mechanisms for verifying data integrity of a non-volatile memory system during data caching process. To ensure integrity of non-volatile flash, the controller programs the non-volatile memories with background test patterns and verifies the non-volatile memories during power on self test (POST) operation. In conjunction with verifying the non-volatile memories, the controller may routinely run diagnostics and report status to the storage controller. As part of the storage controller power up routines, the storage controller issues a POST command to the controller via an $I^2C$ register that is monitored by the storage controller. The storage controller may determine that the non-volatile flash is functional without any defects, and the controller may remove power from the non-volatile flash to extend its reliability. Periodically, in the background, the controller may run diagnostic routines to detect any failures associated with the volatile memory and the controller itself.

As noted above, it should be appreciated that the illustrative embodiments may take the form of an entirely hardware embodiment, an entirely software embodiment or an embodiment containing both hardware and software elements. In one exemplary embodiment, the mechanisms of the illustrative embodiments are implemented in software or program code, which includes but is not limited to firmware, resident software, microcode, etc.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A computer program product comprising a computer recordable medium having a computer readable program recorded thereon, wherein the computer readable program, when executed on a memory system controller, causes the memory system controller to:

responsive to powering on a storage controller, wherein the storage controller comprises a volatile memory and a non-volatile memory, the volatile memory stores cache data for input/output operations performed by the storage controller, and the non-volatile memory hardens cache data from the volatile memory responsive to a power event, and concurrent with the storage controller performing input/output operations using the volatile memory, verify the non-volatile memory, wherein verifying the non-volatile memory comprises:
  programming the non-volatile memory with a set of test patterns;
  reading the set of test patterns from the non-volatile memory;
  verifying whether the non-volatile memory stored the set of test patterns correctly; and
  posting a failure status to the storage controller responsive to the non-volatile memory storing the set of test patterns incorrectly.

2. The computer program product of claim 1, wherein the computer readable program further causes the computing device to:
  run background diagnostics concurrent with the storage controller performing input/output operations.

3. The computer program product of claim 2, wherein running background diagnostics comprises:
  snooping an access to the volatile memory system;
  responsive to the access being a cache read, directing read data to internal buffer locations of a non-volatile memory controller; and
  validating error correction code information in the non-volatile memory controller to validate the internal data pathing within the non-volatile memory controller.

4. The computer program product of claim 2, wherein running background diagnostics comprises:
  responsive to the storage controller writing to the volatile memory, reading the written data from the volatile memory; and
  determining whether a fault exists in the written data.

5. The computer program product of claim 2, wherein running background diagnostics comprises:
  incrementing a programming cycles counter responsive to verifying whether the non-volatile memory stored the set of test patterns correctly; and
  switching to an alternate background diagnostic routine responsive to the programming cycles counter reaching a predetermined value.

6. The computer program product of claim 5, wherein the alternate background diagnostic routine comprises:
  sending write commands to the non-volatile memory;
  verifying that the write commands are acknowledged; and
  reading vendor identification information from the non-volatile memory.

7. The computer program product of claim 1, wherein verifying the non-volatile memory further comprises:
  performing a bulk erase to the non-volatile memory responsive to the non-volatile memory storing the set of test patterns correctly; and
  sending a command to the storage controller to confirm that the non-volatile memory is pre-programmed.

8. The computer program product of claim 7, wherein verifying the non-volatile memory further comprises:
  responsive to sending the command to the storage controller, power down the non-volatile memory.

9. The computer program product of claim 1, wherein posting a failure status to the storage controller comprises:
  posting a status code in an inter-integrated circuit interface register that is monitored by the storage controller.

10. A method, in a memory system, for verifying data integrity of a non-volatile memory system during data caching process, the method comprising:
  responsive to powering on a storage controller, wherein the storage controller comprises a volatile memory and a non-volatile memory, the volatile memory stores cache data for input/output operations performed by the storage controller, and the non-volatile memory hardens cache data from the volatile memory responsive to a power event, and concurrent with the storage controller performing input/output operations using the volatile memory, verify, by a memory system controller in the memory system, the non-volatile memory, wherein verifying the non-volatile memory comprises:
    programming a non-volatile memory with a set of test patterns;
    reading the set of test patterns from the non-volatile memory;
    verifying whether the non-volatile memory stored the set of test patterns correctly; and
    posting a failure status to the storage controller responsive to the non-volatile memory storing the set of test patterns incorrectly.

11. The method of claim 10, further comprising:
  running, by the memory system controller, background diagnostics concurrent with the storage controller performing input/output operations.

12. The method of claim 11, wherein running background diagnostics comprises:
  snooping an access to the volatile memory system;
  responsive to the access being a cache read, directing read data to internal buffer locations of a non-volatile memory controller; and
  validating error correction code information in the non-volatile memory controller, to validate the internal data pathing within the non-volatile memory controller.

13. The method of claim 11, wherein running background diagnostics comprises:
  responsive to the storage controller writing to the volatile memory, reading the written data from the volatile memory; and
  determining whether a fault exists in the written data.

14. The method of claim 11, wherein running background diagnostics comprises:
  incrementing a programming cycles counter responsive to verifying whether the non-volatile memory stored the set of test patterns correctly; and
  switching to an alternate background diagnostic routine responsive to the programming cycles counter reaching a predetermined value.

15. The method of claim 14, wherein the alternate background diagnostic routine comprises:
  sending write commands to the non-volatile memory;
  verifying that the write commands are acknowledged; and
  reading vendor identification information from the non-volatile memory.

16. The method of claim 10, wherein verifying the non-volatile memory further comprises:
  performing a bulk erase to the non-volatile memory responsive to the non-volatile memory storing the set of test patterns correctly;
  sending a command to the storage controller to confirm that the non-volatile memory is pre-programmed; and
  powering down the non-volatile memory.

17. The method of claim 10, wherein posting a failure status to the storage controller comprises:

posting, by the memory system controller, a status code in an inter-integrated circuit interface register that is monitored by the storage controller.

18. A memory system comprising:

a controller, wherein the controller detects a power event from a power supply that provides power to a storage controller and the memory system;

a volatile memory, wherein the volatile memory stores cache data for input/output operations performed by a storage controller; and a non-volatile memory, wherein the controller hardens the cache data from the volatile memory for the storage controller to the non-volatile memory responsive to the power event;

wherein responsive to powering on the storage controller and concurrent with the storage controller performing input/output operations using the volatile memory, the controller verifies the non-volatile memory, wherein verifying the non-volatile memory comprises:

programming the non-volatile memory with a set of test patterns;

reading the set of test patterns from the non-volatile memory;

verifying whether the non-volatile memory stored the set of test patterns correctly; and posting a failure status to the storage controller responsive to the non-volatile memory storing the set of test patterns incorrectly.

19. The memory system of claim 18, wherein the controller runs background diagnostics concurrent with the storage controller performing input/output operations.

20. The memory system of claim 18, wherein the controller posts the failure status to the storage controller in an inter-integrated circuit interface register that is monitored by the storage controller.

* * * * *